United States Patent
Kakkar et al.

(10) Patent No.: US 10,930,828 B2
(45) Date of Patent: Feb. 23, 2021

(54) NON-ROTATIONALLY SYMMETRIC LENS FOR NON-ROTATIONALLY SYMMETRIC LIGHT SOURCE RESULTING IN ROTATIONALLY SYMMETRIC BEAM PATTERN

(71) Applicant: Lumileds LLC, San Jose, CA (US)

(72) Inventors: Varun Dev Kakkar, Eindhoven (NL); Emanuel Nicolaas Hermanus Johannes Stassar, Sprang Capelle (NL); Erno Fancsali, Heusden-Zolder (BE); Chunxia Feng, Shanghai (CN); Rob Jacques Paul Engelen, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/336,408

(22) PCT Filed: Sep. 15, 2017

(86) PCT No.: PCT/EP2017/073233
§ 371 (c)(1),
(2) Date: Mar. 25, 2019

(87) PCT Pub. No.: WO2018/059966
PCT Pub. Date: Apr. 5, 2018

(65) Prior Publication Data
US 2019/0348583 A1 Nov. 14, 2019

Related U.S. Application Data

(60) Provisional application No. 62/400,252, filed on Sep. 27, 2016.

(30) Foreign Application Priority Data

Nov. 3, 2016 (EP) .................... 16196997

(51) Int. Cl.
*H01L 33/58* (2010.01)
*F21V 5/04* (2006.01)
(Continued)

(52) U.S. Cl.
CPC ............ *H01L 33/58* (2013.01); *F21V 5/04* (2013.01); *F21Y 2107/40* (2016.08); *F21Y 2115/10* (2016.08); *G02B 27/0955* (2013.01)

(58) Field of Classification Search
CPC ..... H01L 33/58; H01L 33/502; H01L 33/505; H01L 33/507; H01L 33/60; F21V 5/00
See application file for complete search history.

(56) References Cited

U.S. PATENT DOCUMENTS

| | | | |
|---|---|---|---|
| 2006/0102914 | A1 | 5/2006 | Smits et al. |
| 2012/0113621 | A1 | 5/2012 | Lee et al. |

(Continued)

FOREIGN PATENT DOCUMENTS

| | | |
|---|---|---|
| CN | 109791323 A | 5/2019 |
| TW | 201820659 A | 6/2018 |
| WO | WO-2018/059966 A1 | 4/2018 |

OTHER PUBLICATIONS

"European Application Serial No. EP 16196997, European Search Report dated May 19, 2017", 6 pgs.

(Continued)

*Primary Examiner* — Changhyun Yi
(74) *Attorney, Agent, or Firm* — Schwegman Lundberg & Woessner, P.A.

(57) ABSTRACT

A light source includes a light-emitting diode or device (LED) and an optic mounted over the LED. The LED emits a first radiation pattern that is non-rotationally symmetric about a first axis. The optic collects the first radiation pattern and projects a second radiation pattern that is rotational (Continued)

symmetric about a second axis and has a peak intensity that is angled from the second axis.

11 Claims, 8 Drawing Sheets

(51) Int. Cl.
*F21Y 107/40* (2016.01)
*F21Y 115/10* (2016.01)
*G02B 27/09* (2006.01)

(56) References Cited

U.S. PATENT DOCUMENTS

| | | |
|---|---|---|
| 2013/0003388 A1 | 1/2013 | Jensen et al. |
| 2015/0055325 A1 | 2/2015 | Lin |
| 2015/0117016 A1* | 4/2015 | Kim .......................... F21K 9/64 |
| | | 362/293 |
| 2016/0141472 A1 | 5/2016 | Son et al. |

OTHER PUBLICATIONS

"International Application Serial No. PCT/EP2017/073233, International Preliminary Report on Patentability dated Apr. 11, 2019", 13 pgs.
"International Application Serial No. PCT/EP2017/073233, International Search Report dated Dec. 4, 2017", 4 pgs.
"International Application Serial No. PCT/EP2017/073233, Reply filed Apr. 15, 2019 to Interntional Search Report and Written Opinion dated Dec. 12, 2017", 24 pgs.
"International Application Serial No. PCT/EP2017/073233, Written Opinion dated Dec. 4, 2017", 11 pgs.

* cited by examiner

NON-ROTATIONALLY SYMMETRIC LENS FOR NON-ROTATIONALLY SYMMETRIC LIGHT SOURCE RESULTING IN ROTATIONALLY SYMMETRIC BEAM PATTERN

FIELD OF THE INVENTION

The present disclosure relates to a non-rotationally symmetric optic for non-rotationally symmetric light-emitting diodes or devices (LEDs).

BACKGROUND

A light-emitting diode or device (LED) is typically a surface emitter that emits light from its top surface. The top surface is usually square or rectangular. When a rotationally symmetric secondary lens is placed on top of one or more LEDs, the resulting radiation pattern is not completely rotationally symmetrical. In other words, radiation pattern slices taken at various angles from the radiation pattern have different luminous intensity profiles. To what extent this happens depends on the exact shapes of the top emitting surface and the secondary lens.

A 5-sided emitting LED is a high power LED that emits light from its top surface as well as its vertical side surfaces. The resulting radiation pattern of the high power LED is also not completely rotationally symmetrical, in particular when combined with a secondary lens.

US 2012/0113621 A1 discloses a LED package comprising a LED and a lens with a cavity, both provided on a substrate, with the LED in the cavity. The LED emits a radiation pattern that is symmetric with respect to the center axis of the light emitting surface of the LED in planes perpendicular to the top emitting surface. Different planes have different light distributions.

US 2016/141472 A1 discloses a light emitting device package including a package body, a frame located on the package body, a light source mounted on the frames, a lens located on the package body, and a wavelength conversion unit partially located on the package body between the package body and the lens. In case an asymmetrical light source is used, of which light source the minor-axis length differs from the major-axis lengths, the wavelength conversion unit may provide the effect as if the asymmetrical light source has the same minor-axis length as the major-axis lengths.

US 2006/0102914 A1 discloses a wide emitting lens for an LED. The lens has a hollow portion that forms an air gap between the LED die and the lens.

SUMMARY

In one or more examples of the present disclosure, a light source includes a light-emitting diode or device (LED) and an optic mounted over the LED. The LED emits a first radiation pattern that is non-rotationally symmetric about a first axis. The optic collects the first radiation pattern and projects a second radiation pattern that is rotational symmetric about a second axis.

BRIEF DESCRIPTION OF THE DRAWINGS

In the drawings.

Use of the same reference numbers in different figures indicates similar or identical elements.

DETAILED DESCRIPTION

Figure 1:
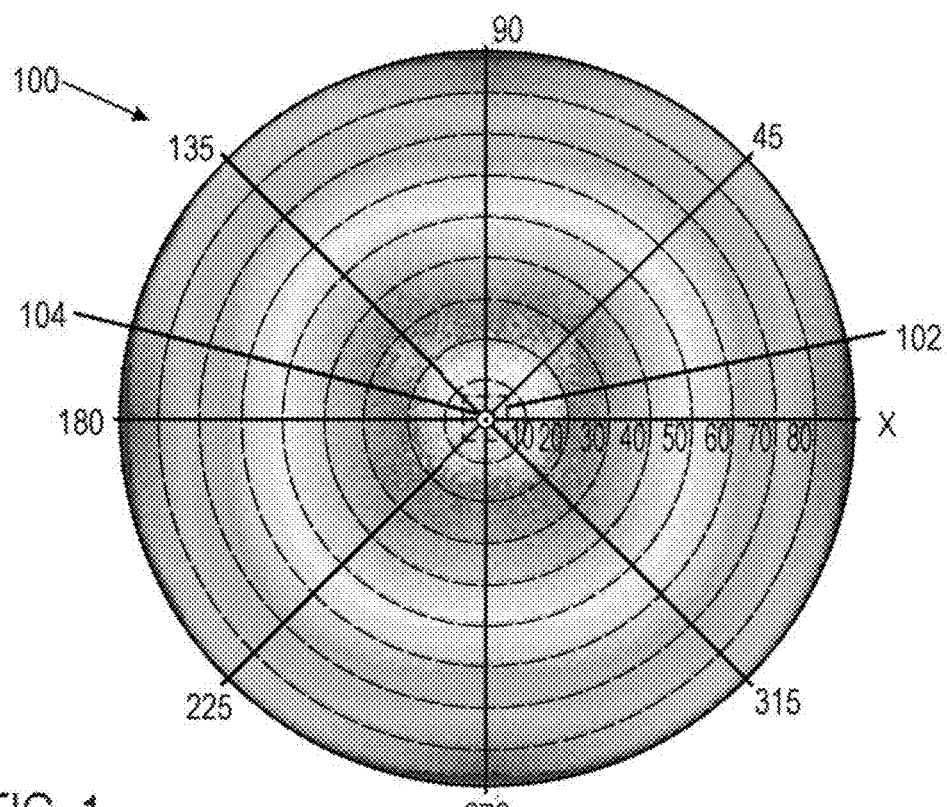
FIG. 1 shows a plot of a radiation pattern of a light-emitting diode or device (LED), measured in various directions and angles relative to the top emitting surface of the LED.

FIG. 1 shows a plot of a radiation pattern 100 of a light-emitting diode or device (LED) 102 (in phantom), measured in various directions and angles relative to the top emitting surface of LED 102. LED 102 has a top emitting surface and side emitting surfaces. The top emitting surface is a regular polygon including an odd or an even number of edges. For example, LED 102 is cuboid and has a square top emitting surface and rectangular side emitting surfaces.

Radiation pattern 100 is plotted about a center axis 104 (e.g., the Z-axis), which is either the optical axis or the mechanical axis of LED 102. The optical axis is the axis through the center of the top emitting surface in the direction of the centroid of the optical radiation pattern. The mechanical axis is the axis through the center of the top emitting surface in the direction of the axis of symmetry of the emitter body or perpendicular to the top emitting surface.

Figure 2:
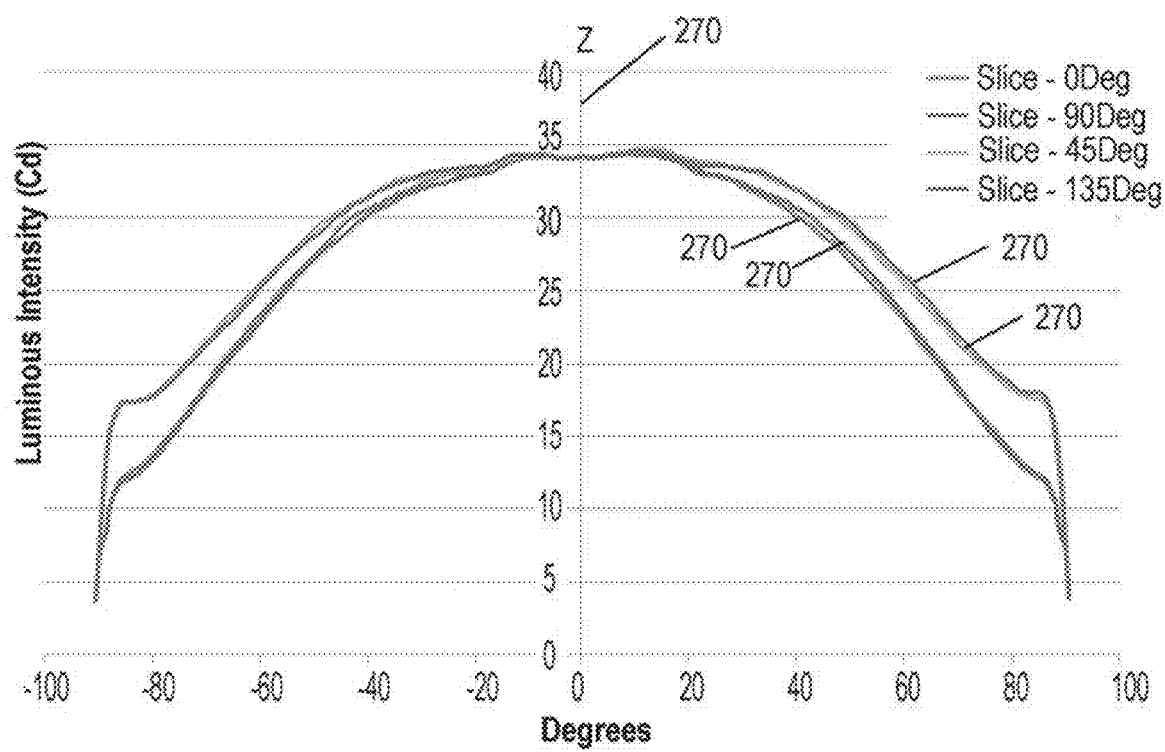
FIG. 2 shows radiation pattern slices taken at various directions from the radiation pattern of FIG. 1.

FIG. 2 shows radiation pattern slices taken at various directions from radiation pattern 100 (FIG. 1). Radiation pattern 100 includes a first set of substantially similar luminous intensity profiles taken in first directions from the center of the top emitting surface to midpoints of the edges of the top emitting surface (e.g., axial directions), a second set of substantially similar luminous intensity profiles taken in second directions from the center of the top emitting surface to the corners of the top emitting surface (e.g., diagonal directions), and intermediate luminous intensity profiles between any pair of neighboring first and second directions.

For example, the 0° radiation pattern slice 202 is measured in a plane parallel to a first of the four sides of the emitter (e.g., along the X-axis). The 45° radiation pattern slice 204 is measured 45° off axis relative to the 0° radiation pattern slice. The 90° radiation pattern slice 206 is measured in a plane parallel to a second side (or a fourth side) of the emitter adjacent to the first side of the emitter (e.g., along the Y-axis). The 135° radiation pattern slice 208 is measured 135° off axis relative to the 0° radiation pattern slice. The 0° and the 90° radiation pattern slices 202 and 206 have substantially similar luminous intensity profiles. The 45° and the 145° radiation pattern slices 204 and 208 have substantially similar luminous intensity profiles that are greater than those of the 0° and the 90° radiation pattern slices 202 and 206. Intermediate radiation pattern slices between an axial direction (0, 90, 180, or 270°) and an adjacent diagonal direction (45, 135, 225, or 315°) have intermediate luminous intensity profiles that increase from the luminous intensity profile of the slice in the axial direction to the luminous intensity profile of the slice in the diagonal direction.

As described above, radiation pattern 100 is non-rotationally symmetric about center axis 104. In other words, radiation pattern 100 cannot be produced by rotating the luminous intensity profile of a single slice about center axis 104.

A conventional rotationally symmetric optic is often used with LED 102. When LED 102 has a non-rotationally symmetrical radiation pattern, the rotationally symmetrical optic collects the pattern and projects a non-rotationally symmetrical output beam.

Figure 3:
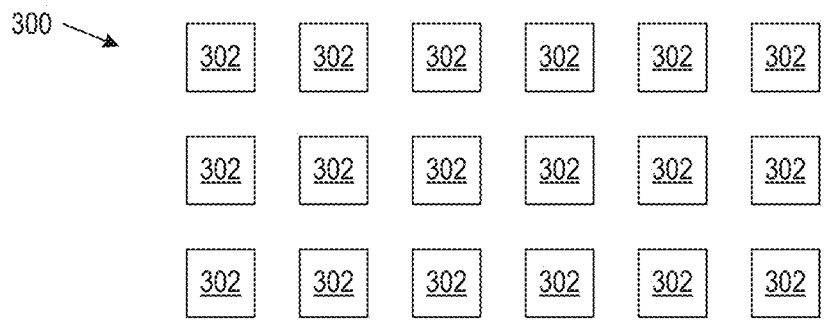
FIG. 3 shows a two-dimensional array of light sources each having a rotationally symmetrical optic mounted on a non-rotationally symmetrical LED.

FIG. 3 shows a two-dimensional array 300 of light sources 302. For example, light sources 302 are arranged in a 3 by 6 grid. Each light source 302 includes a non-rotationally symmetrical LED 102 and a dome-shaped lens. Array 300 is well suited for applications such as backlights for monitors and TVs, troffers, and luminaires. In these applications, it is important to mix light from neighboring light sources 302 in order to provide a uniform light emitting surface.

Figure 4:
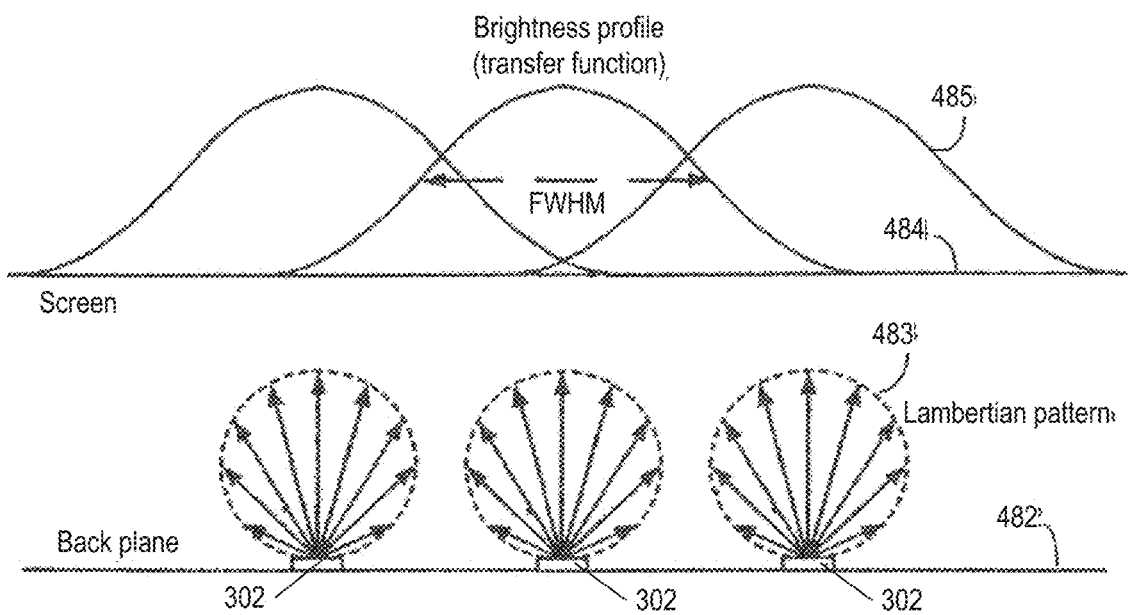
FIG. 4 shows emission patterns and their overlapping brightness profile of the light sources of FIG. 4 on a screen 402.

FIG. 4 shows light sources 302 mounted on a backplane 482. Each light source 302 emits light in a Lambertian pattern 483. Light sources 302 illuminate the back of a diffusive screen 484. Diffusive screen 484 may be a diffuser in an LCD backlight. The diffused brightness profile 485 of each light source 302 and its full width at half maximum (FWHM) are also shown. The nearfield light output at the front of screen 484 has noticeable bright spots unless lights sources 302 are placed close enough together. Therefore, such a backlight requires a relatively high density of light sources 302, resulting in an expensive backlight.

FIGS. 5, 6, 7, 8, and 9 show various views of a non-rotationally symmetrical optic 500 in examples of the present disclosure. Non-rotationally symmetrical optic 500 is mounted over non-rotationally symmetrical LED 102. Optic 500 collects radiation pattern 100 from LED 102 and projects a radiation pattern that is rotational symmetrical about its center axis 502 (FIG. 6), which is the mechanical or the optical axis of optic 500. In other words, the projected radiation pattern has the same luminous intensity profile in all directions from the center of the LED's top emitting surface to points along the perimeter of the top emitting surface. In some examples of the present disclosure, optic 500 is a wide-emitting lens that has peak emission ($I_{peak}$) within 50 to 80° or 70 to 80° off center axis 502 in the far field. Optic 600 may be designed so that the light emission ($I_O$) along center axis 502 is 5 to 33% of the peak emission. Accordingly, the brightness profile for each LED 102 with optic 500 is more spread out as compared to brightness profile 485 in FIG. 4. Optic 500 is mounted over LED 102 to substantially coincide axes 104 and 502.

Figure 6:
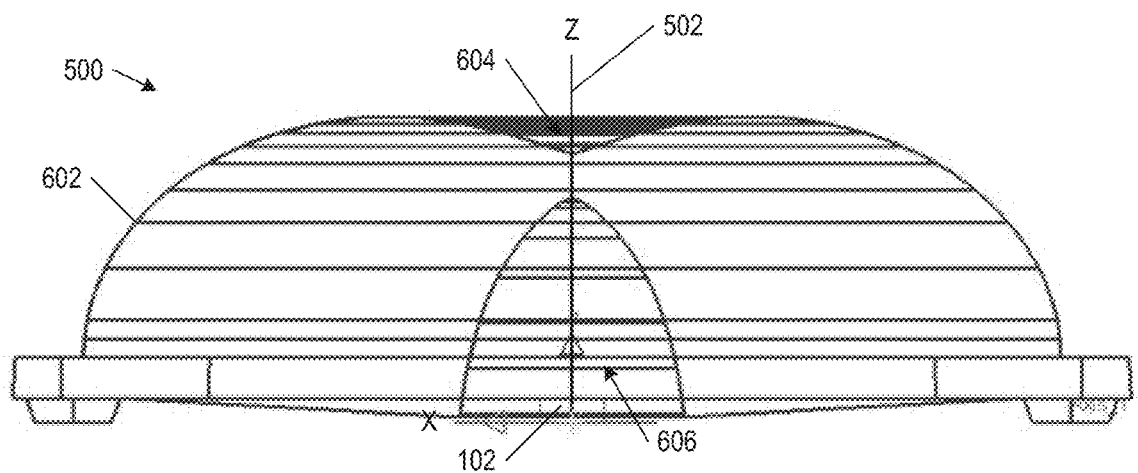
FIG. 6 shows a cross-sectional view of the optic of FIG. 5 along an axial direction of an LED in examples of the present disclosure.
Figure 7:
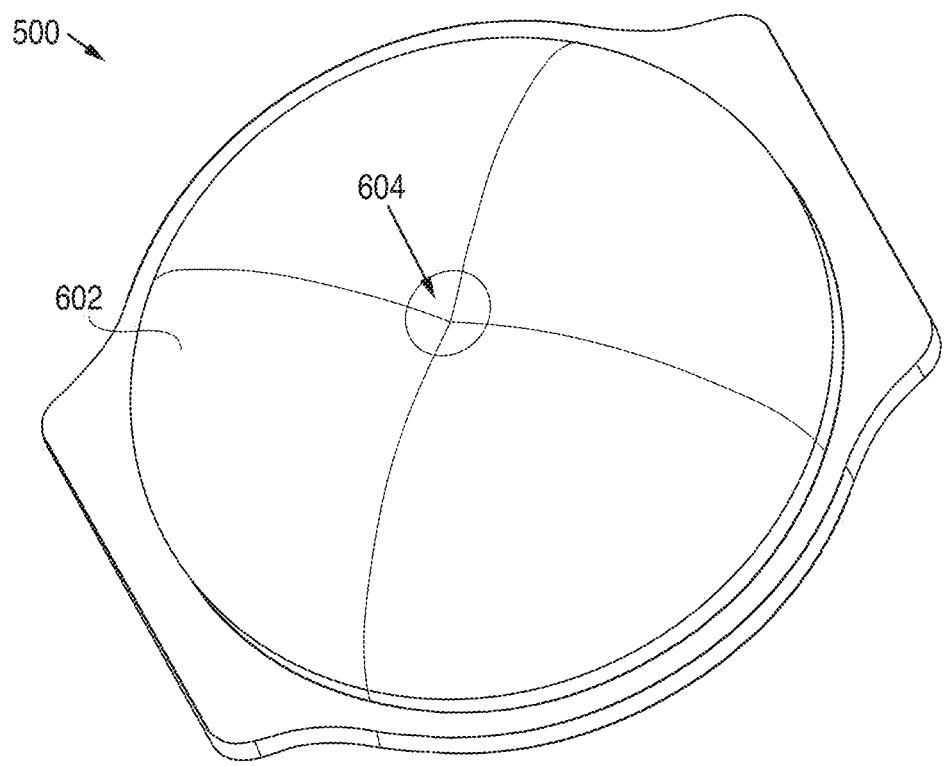
FIGS. 7 and 8 show top and bottom isometric views of the optic of FIG. 5 in examples of the present disclosure.
Figure 8:
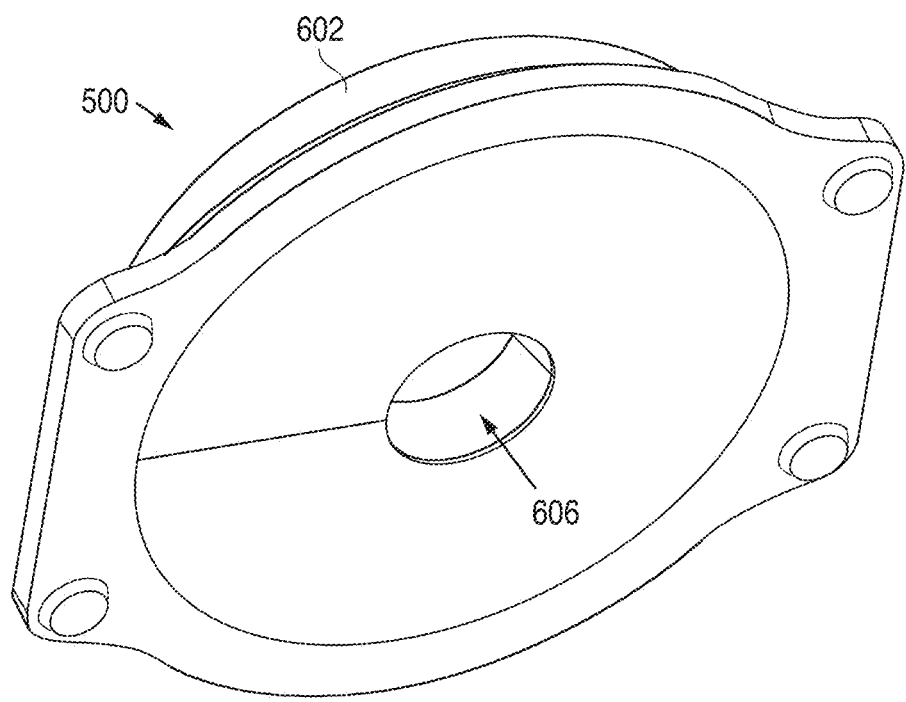

Referring to FIGS. 6, 7, and 8, in one particular example of the present disclosure, optic 500 includes a body 602, an optional dimple 604 at the top of body 602, and an inner cavity 606 at the bottom of body 602. Body 602 may be freeform or defined by equations. For example, body 602 may have a shape similar to a saucer dome, which has a rise smaller than its span. Dimple 604 may have the shape of an inverted cone. The cross-section of the inverted cone may be a smooth curve instead of a straight line. Inner cavity 606 may be freeform or have the shape of a cone or an ogive. Inner cavity 606 provides a space to accommodate LED 102. Optic 500 and LED 102 (shown in phantom in FIG. 6) may be fixed relative to each other, such as being mounted on a common substrate, so LED 102 is located substantially inside inner cavity 606.

At least one of body 602, dimple 604, and inner cavity 606 has an optical surface that is non-rotationally symmetric about center axis 502. The optical surface includes a first surface profile in the first directions of LED 102 (i.e., from the center of the top emitting surface to midpoints of the edges of the top emitting surface), a second surface profile in the second directions of LED 102 (from the center of the top emitting surface to the corners of the top emitting surface), and intermediate surface profiles between any pair of neighboring first and second surface profiles.

Figure 5:
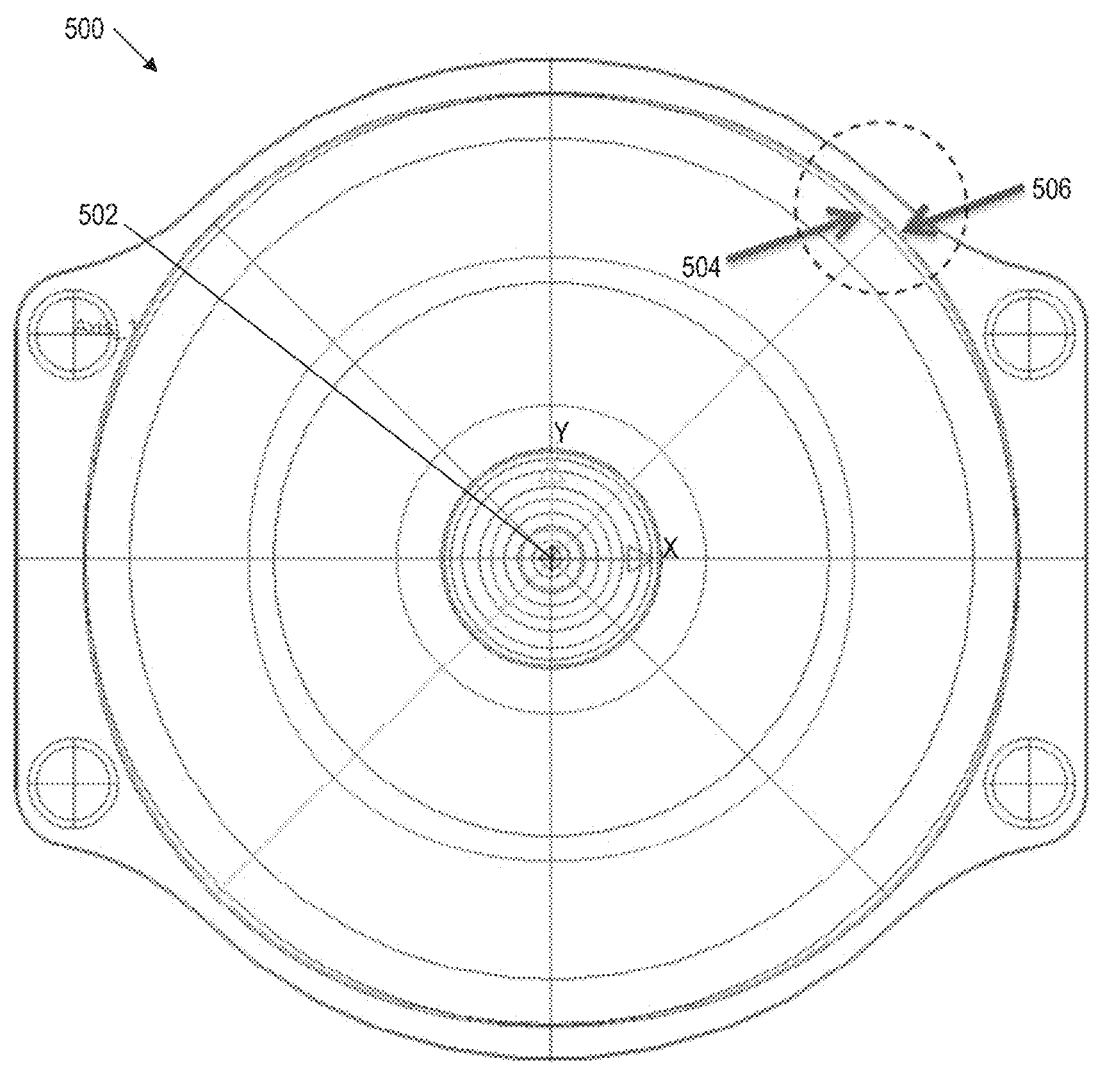
FIG. 5 shows a top view of a non-rotationally symmetrical optic in examples of the present disclosure.

For example, FIG. 5 highlights the contour 504 of a rotationally symmetrical body and the contour 506 of a non-rotationally symmetrical body 602. A non-rotationally symmetrical body 602 has an optical surface where the 0 and 90° cross-sections of the optical surface have a minimum surface profile, the 45 and 135° cross-sections of the optical surface have a maximum surface profile, intermediate cross-sections between an axial direction (0, 90, 180, or 270°) and a diagonal direction (45, 135, 225, or 315°) have intermediate surface profiles that increase from the minimum surface profile to the maximum surface profile. Alternatively, non-rotationally symmetrical body 602 has an optical surface where the 0 and 90° cross-sections of the optical surface have a maximum surface profile, the 45 and 135° cross-sections of the optical surface have a minimum surface profile, intermediate cross-sections between an axial direction (0, 90, 180, or 270°) and a diagonal direction (45, 135, 225, or 315°) have intermediate surface profiles that increase from the minimum surface profile to the maximum surface profile.

Figure 9:
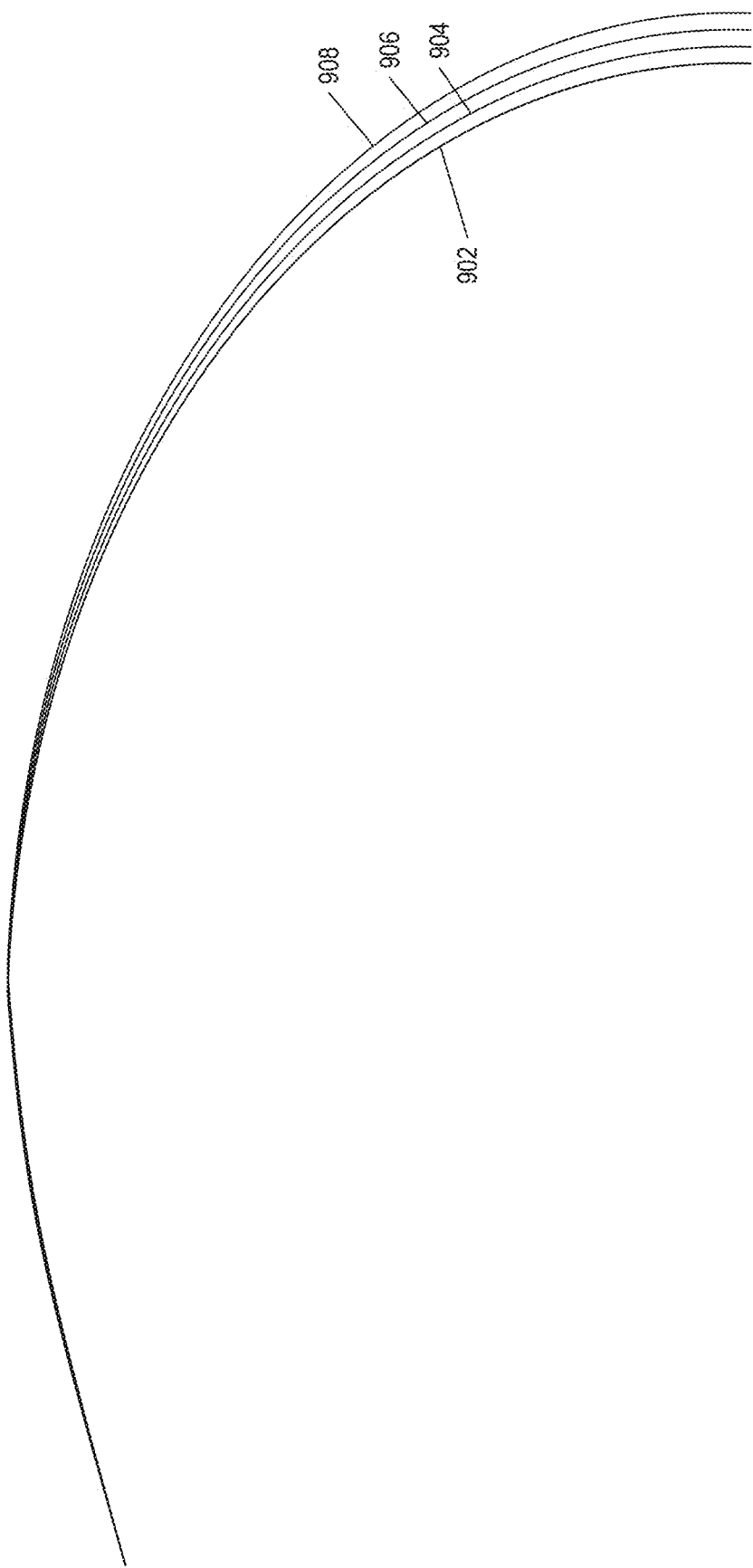
FIG. 9 shows partial cross-sections of a non-rotationally symmetrical body of the optic of FIG. 5 in examples of the present disclosure.

FIG. 9 overlays partial cross-sections of a non-rotationally symmetrical body 602 in examples of the present disclosure. Cross-section 902 is the minimum surface profile at an axial direction, cross-section 908 is the maximum surface profile at a diagonal direction, and cross-sections 904 and 906 are intermediate surface profiles between the axial and the diagonal directions.

Figure 10:
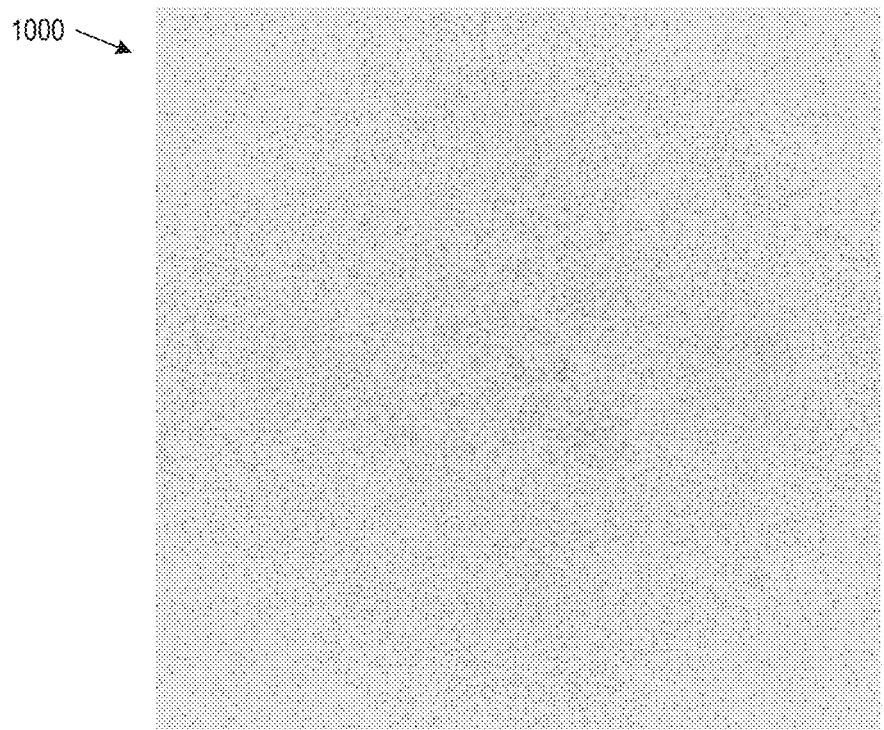
FIG. 10 shows the rotationally symmetrical output beam of a non-rotationally symmetrical LED with the non-rotationally symmetrical optic of FIG. 5 in examples of the present disclosure.
Figure 11:
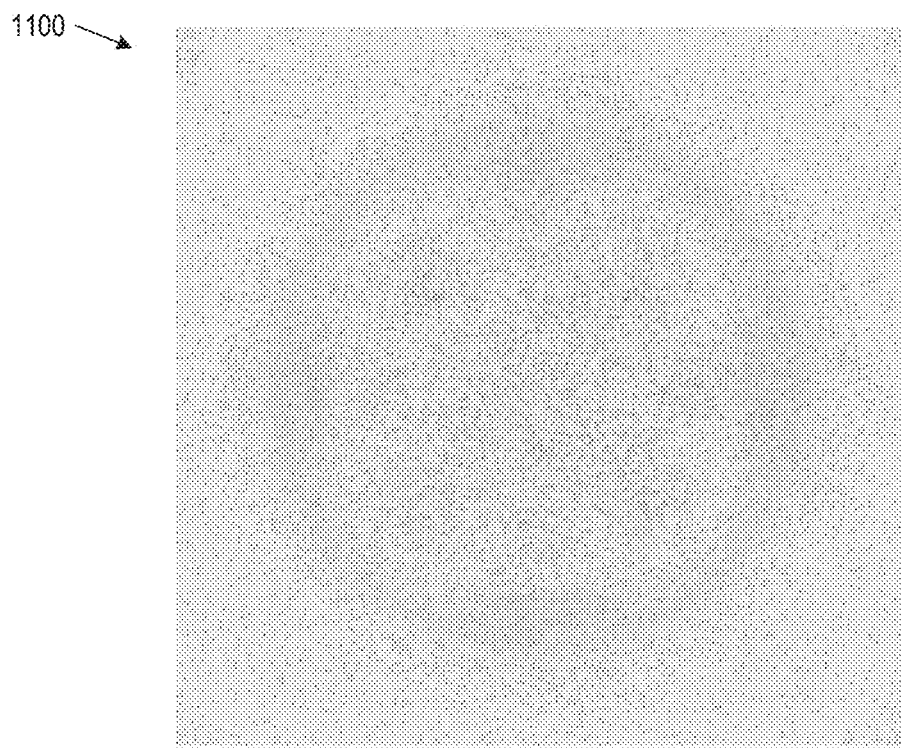
FIG. 11 shows the non-rotationally symmetrical output beam of a non-rotationally symmetrical LED with rotationally symmetrical optic.

The non-rotationally symmetrical optical surface counters the effect of the non-rotationally symmetrical LED 102 to produce an output beam that is rotationally symmetrical. FIG. 10 shows a substantially rotationally symmetrical output beam 1000 of a light source with a non-rotationally symmetric optic 500 mounted over a non-rotationally symmetric LED 102 in examples of the present disclosure. In contrast, FIG. 11 shows the non-rotationally symmetrical output beam 1100 of a light source with a rotationally symmetrical optic mounted over a non-rotationally symmetric LED 102. The non-uniformity of output beam 1100 is highly visible along the diagonal directions of LED 102. As can be seen from these figures, the non-uniformity present in output beam 1100 have been reduce in output beam 1000.

Figure 12:
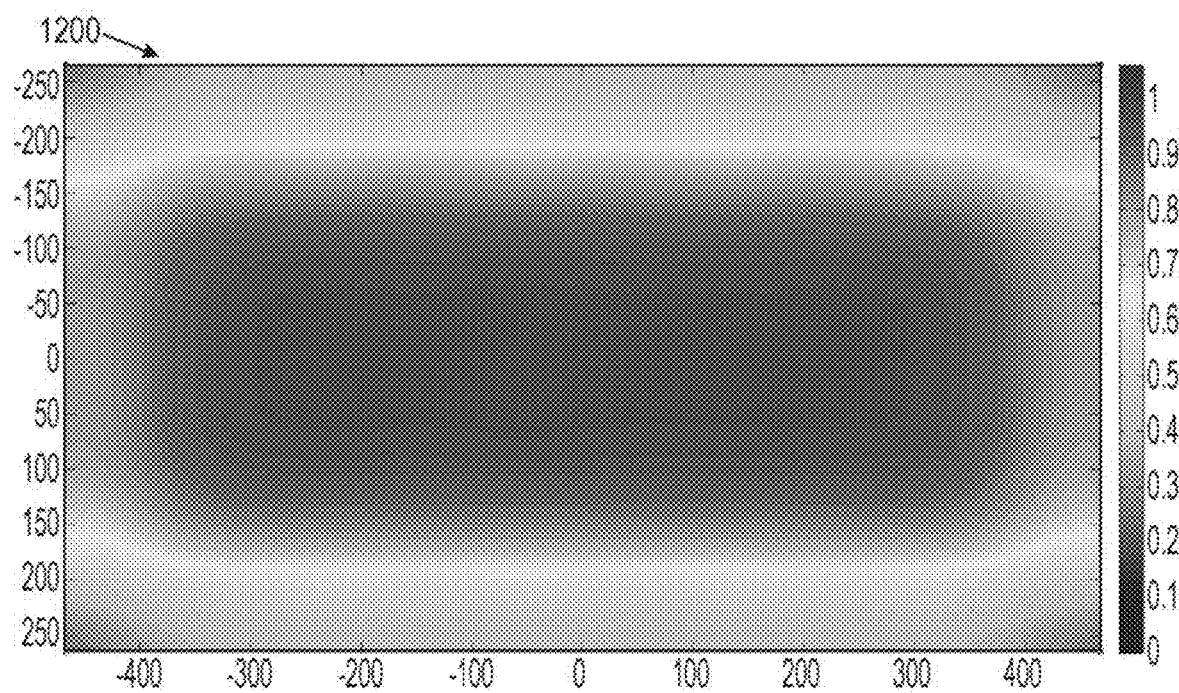
FIG. 12 shows a radiation pattern of the array of FIG. 4 fitted with the non-rotationally symmetrical optics of FIG. 5 in examples of the present disclosure.
Figure 13:
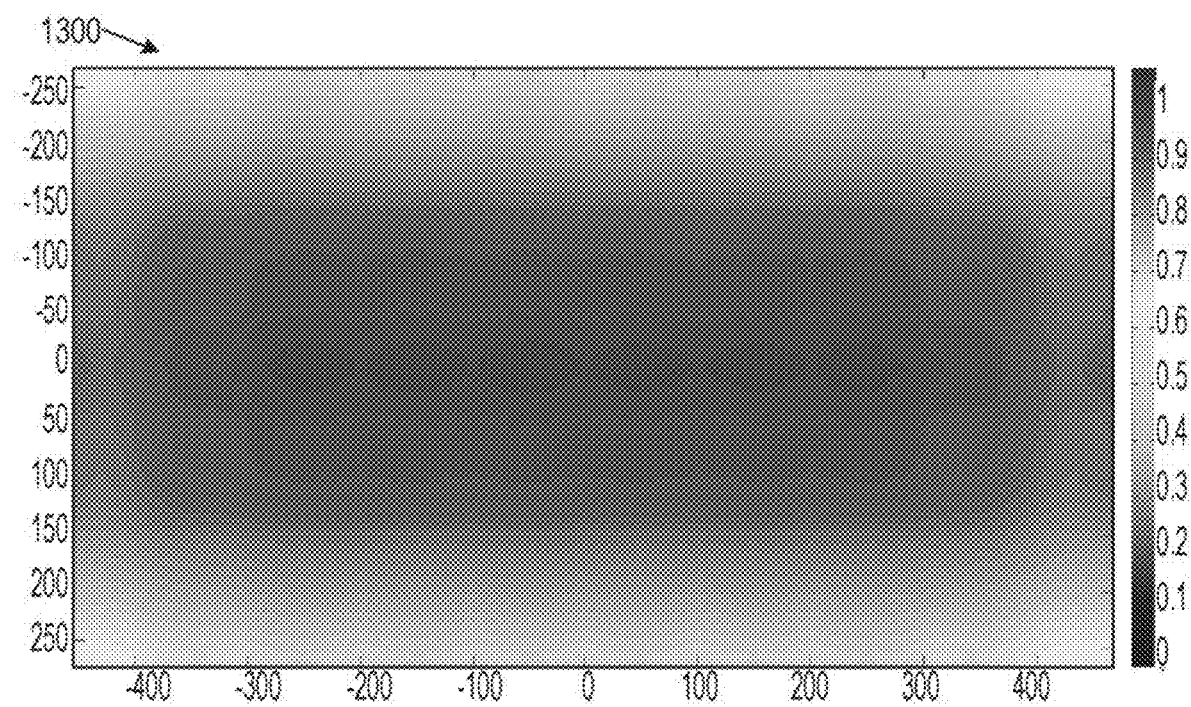
FIG. 13 shows a radiation pattern of the array of FIG. 3 fitted with rotationally symmetrical optics.

FIG. 12 shows a radiation pattern 1200 of array 300 where light sources 302 are non-rotationally symmetrical LEDs 102 fitted with non-rotationally symmetrical optics 500 in examples of the present disclosure. Radiation pattern 1200 has a uniform distribution within the grid of light sources 302. In contrast, FIG. 13 shows a radiation pattern 1300 of array 300 where light sources 302 are non-rotationally symmetrical LEDs 102 fitted with rotationally symmetrical optics. Radiation pattern 1300 has non-uniformities and periodic variations from adding the non-rotationally symmetrical output beams of light sources 302 (not shown). These effects are not acceptable in certain backlight, troffer, and luminaire applications. The non-uniformities and periodic variations become more prominent when the pitch of the light sources increases and each light source individually illuminates certain area of the backlight, troffer, or luminaire.

Figure 14:
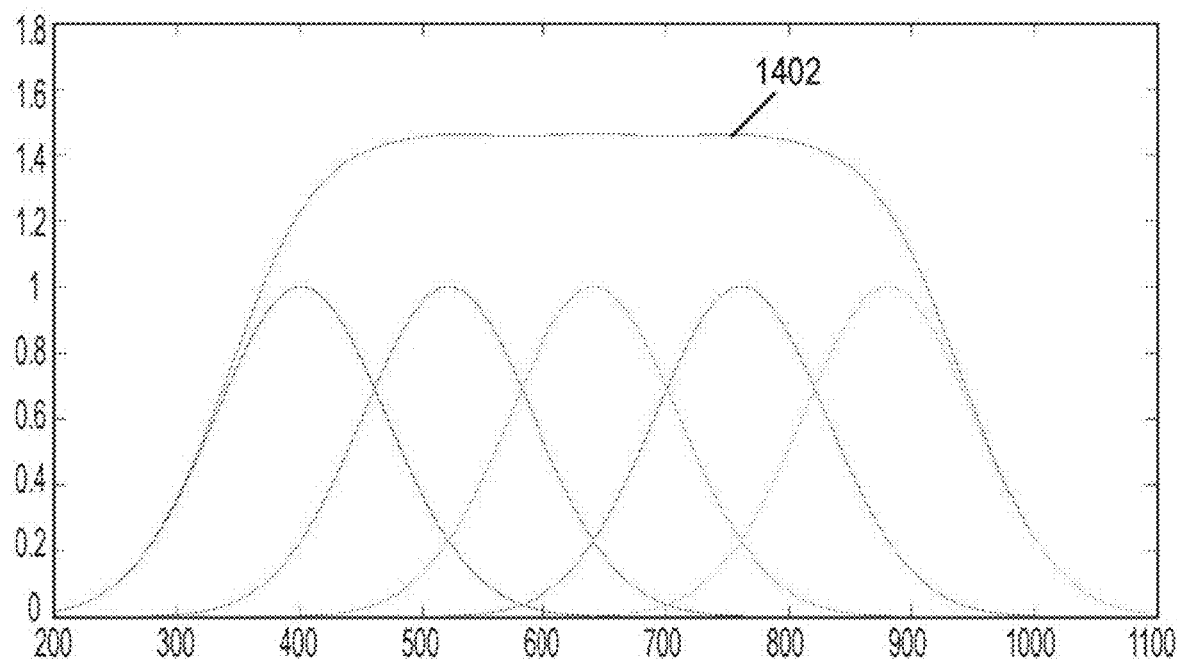
FIG. 14 shows the addition of Gaussian profiles of light sources fitted with the non-rotationally symmetrical optics of FIG. 5 in the near field in examples of the present disclosure.

In examples of the present disclosure, optical surfaces of body 702, dimple 704, and inner cavity 706 combine to provide a radiation pattern that has a substantially Gaussian profile. FIG. 14 shows the plots of five light sources 302 that are non-rotationally symmetrical LEDs 102 fitted with non-rotationally symmetrical optics 600 in examples of the present disclosure. In some examples, light source 302 have Gaussian profiles with a FWHM (e.g., 140 mm) greater than the pitch between light sources 302 (e.g., 120 mm) so the individual Gaussian profiles add smoothly to give a flat and uniform final distribution 1402.

Figure 15:
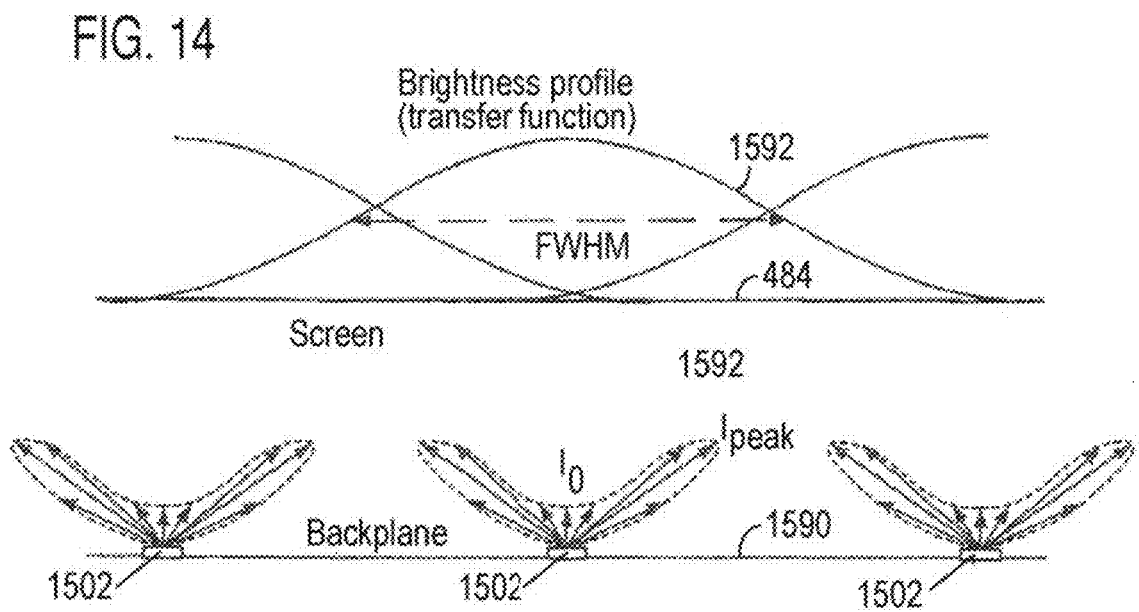
FIG. 15 shows the wide angle emission patterns of light sources fitted with the non-rotationally symmetrical optics of FIG. 5 and their overlapping brightness profiles on a screen in examples of the present disclosure.

FIG. 15 shows a backlight with light sources 1502 mounted to a backplane 1590 in examples of the present disclosure. Each light source 1502 includes a non-rotationally symmetrical LED 102 and a non-rotationally symmetrical, wide-emitting optic 500 mounted on LED 102. As mentioned before, the brightness profile 1592 for light source 1502 is more spread out as compared to brightness profile 485 in FIG. 4. Therefore, the pitch of light sources 1502 in the backlight of FIG. 15 can be larger than the pitch of light sources 302 in FIG. 4 while achieving the same near field light output uniformity at diffusive screen 484. This results in a less expensive backlight.

Figure 16:
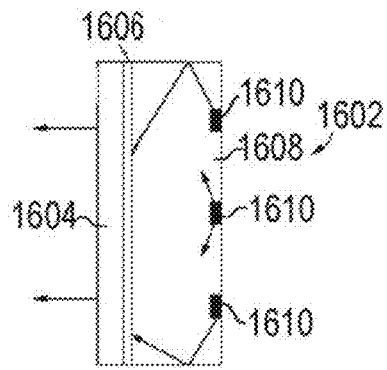
FIG. 16 shows a side view of a liquid crystal display using LEDs with side-emitting lenses in a backlight in examples of the present disclosure.

FIG. 16 shows a side view of a liquid crystal display 1602 with an LCD screen 1604, having controllable RGB pixels, a diffuser 1606, and a backlight 1608 for mixing light from red, green, and blue LEDs 1610, or white LEDs 1610, to create white light. Backlight 1608 is a diffusively reflective box. LEDs 1610 have side-emitting lenses made using the above-described techniques.

Various other adaptations and combinations of features of the embodiments disclosed are within the scope of the invention. Numerous embodiments are encompassed by the following claims.

The invention claimed is:
1. A light source, comprising:
a light-emitting diode configured to emit light from a substantially square top emitting surface and a plurality of substantially rectangular side emitting surfaces, each side emitting surface adjoining a corresponding edge of the top emitting surface and being generally orthogonal to the top emitting surface,
the emitted light forming a first radiation pattern that is non-rotationally symmetric about a center axis of the top emitting surface,
the first radiation pattern including:
a first luminous intensity profile in a first plane, the first plane including the center axis and a first direction from the center axis to a midpoint of an edge of the top emitting surface;
a second luminous intensity profile in a second plane, the second plane including the center axis and a second direction perpendicular to the first direction, the second luminous intensity profile being substantially the same as the first luminous intensity profile; and
a diagonal luminous intensity profile in a diagonal plane, the diagonal plane including the center axis and a diagonal direction from the center axis to a corner of the top emitting surface, the diagonal luminous intensity profile being greater than the first luminous intensity profile and the second luminous intensity profile; and
an optic mounted over the light-emitting diode, the optic configured to collect the first radiation pattern and, in response, project a second radiation pattern,
the optic including a body with a bottom surface that forms an inner cavity at a bottom of the body to accommodate the light-emitting diode,
the bottom surface including:
a first surface profile in the first plane;
a second surface profile in the second plane, the second surface profile being substantially the same as the first surface profile; and
a diagonal surface profile in the diagonal plane, the diagonal surface profile being different from the first and second surface profiles,
the second radiation pattern being rotationally symmetric about the center axis and having a peak intensity that is angled from the center axis in a far field.

2. The light source of claim 1, wherein the optic is a lens.

3. The light source of claim 1, wherein the optic comprises a dimple at the top of the body.

4. The light source of claim 1, wherein the peak intensity occurs about 50 to about 80 degrees off the center axis in the far field.

5. The light source of claim 1, wherein the plurality of substantially rectangular side emitting surfaces includes four side emitting surfaces.

6. A lighting apparatus, comprising a grid of light sources, wherein the light sources are each the light source of claim 1 and their second radiation patterns combine to form a uniform distribution within the grid.

7. The lighting apparatus of claim 6, wherein at least one of the second radiation patterns has a substantially Gaussian profile.

8. A lighting apparatus, comprising:
a light-emitting diode configured to emit light from a substantially square top emitting surface and a plurality of substantially rectangular side emitting surfaces, each side emitting surface adjoining a corresponding edge of the top emitting surface and being generally orthogonal to the top emitting surface,
the emitted light forming a first radiation pattern that varies as a function of azimuthal direction about a center axis of the top emitting surface, the first radiation pattern having minima along azimuthal directions that correspond to respective edges of the top emitting surface, the first radiation pattern having maxima along azimuthal directions that correspond to diagonals of the top emitting surface; and a lens configured to receive the first radiation pattern and, in response, project a second radiation pattern, the second radiation pattern being substantially rotationally symmetric about the center axis, the second radiation pattern having a peak intensity that is angled away from the center axis, the lens including an optical surface that is rotationally non-symmetric about the center axis.

9. The lighting apparatus of claim 8, wherein the lens comprises a bottom surface that faces the light-emitting diode and a top surface opposite the bottom surface, the optical surface that is rotationally non-symmetric about the center axis including the bottom surface.

10. A lighting apparatus, comprising:
a first light-emitting diode configured to emit first light from a first top emitting surface and a plurality of first side emitting surfaces, each first side emitting surface adjoining a corresponding edge of the first top emitting surface, the emitted first light forming a first radiation pattern that varies as a function of azimuthal direction about a first center axis of the first top emitting surface, the first radiation pattern having minima along azimuthal directions that correspond to edges of the first top emitting surface, the first radiation pattern having maxima along azimuthal directions that correspond to diagonals of the first top emitting surface;

a first lens configured to receive the first radiation pattern and, in response, project a second radiation pattern, the second radiation pattern being substantially rotationally symmetric about the first center axis, the second radiation pattern having a peak intensity that is angled away from the first center axis, the first lens including at least one optical surface that is non-rotationally symmetric about the first center axis;

a second light-emitting diode configured to emit first light from a second top emitting surface and a plurality of second side emitting surfaces, the second top emitting surface being substantially parallel to the first top emitting surface, each second side emitting surface adjoining a corresponding edge of the second top emitting surface, the emitted second light forming a third radiation pattern that varies as a function of azimuthal direction about a second center axis of the second top emitting surface, the third radiation pattern having minima along azimuthal directions that correspond to edges of the second top emitting surface, the third radiation pattern having maxima along azimuthal directions that correspond to diagonals of the second top emitting surface; and a second lens configured to receive the third radiation pattern and, in response, project a fourth radiation pattern, the fourth radiation pattern being substantially rotationally symmetric about the second center axis, the fourth radiation pattern having a peak intensity that is angled away from the second center axis, the second lens including at least one optical surface that is rotationally non-symmetric about the second center axis.

11. The lighting apparatus of claim 10, wherein the first light-emitting diode and the second light-emitting diode are positioned such that the second radiation pattern and the fourth radiation pattern overlap to form a generally uniform illumination pattern.

\* \* \* \* \*